US007903430B2

(12) United States Patent
Yang

(10) Patent No.: US 7,903,430 B2
(45) Date of Patent: Mar. 8, 2011

(54) RECESSED LIGHT BALLAST MOUNT

(76) Inventor: Kevin Yang, Palos Verdes Estates, CA (US)

( * ) Notice: Subject to any disclaimer, the term of this patent is extended or adjusted under 35 U.S.C. 154(b) by 523 days.

(21) Appl. No.: 12/152,693

(22) Filed: May 17, 2008

(65) Prior Publication Data

US 2009/0284168 A1 Nov. 19, 2009

(51) Int. Cl.
*H05K 7/02* (2006.01)

(52) U.S. Cl. .......................... 361/807; 361/829; 361/748

(58) Field of Classification Search .................. 361/600, 361/679.01, 807, 809, 810, 829, 736, 741, 361/748; 362/217.1, 217.11–217.17, 362, 362/368

See application file for complete search history.

(56) References Cited

U.S. PATENT DOCUMENTS

| | | | | |
|---|---|---|---|---|
| 3,662,164 | A * | 5/1972 | Wood | 362/362 |
| 3,755,667 | A * | 8/1973 | Price | 362/147 |
| 4,924,152 | A * | 5/1990 | Flickinger | 315/363 |
| 5,019,938 | A * | 5/1991 | Sridharan et al. | 361/674 |
| 5,023,521 | A * | 6/1991 | Sridharan | 315/290 |
| 5,140,225 | A * | 8/1992 | Barton | 315/210 |
| 5,727,871 | A * | 3/1998 | Kotloff | 362/225 |
| 6,039,582 | A * | 3/2000 | Geis et al. | 439/76.1 |
| 6,059,424 | A * | 5/2000 | Kotloff | 362/220 |
| 6,301,096 | B1 * | 10/2001 | Wozniczka | 361/674 |
| 6,850,412 | B2 * | 2/2005 | Peter | 361/736 |
| 7,144,129 | B2 * | 12/2006 | Mackin | 362/223 |

* cited by examiner

*Primary Examiner* — Thuy Vinh Tran
(74) *Attorney, Agent, or Firm* — Clement Cheng

(57) ABSTRACT

A lamp ballast is provided for attachment to a fluorescent lamp fixture. The ballast is adapted to a direct low profile mounting on a junction box of the lamp fixture by a varying degree of recessed positioning. The ballast has a built-in niche for the recessed mounting and comprises a ballast circuit on a board; a package for enclosing the circuit board save electric wires from and to the ballast circuit at multiple sides including a top surface, bottom surface and sidewalls extending between the top and bottom surfaces; and a flange extending from the sidewalls of the package at a predetermined level between the top and bottom surfaces. Thus, the flange acts as a mounting bracket of the ballast for a varied degree of recessed mounting of the ballast on the lamp fixture.

11 Claims, 3 Drawing Sheets

RECESSED LIGHT BALLAST MOUNT

BACKGROUND OF THE INVENTION

A. Field of the Invention

The present invention relates to lighting fixtures. More particularly, the present invention relates to a lamp ballast case that has a bracket at an advanced position for withdrawing the ballast to fit in a tight space about fluorescent lamp fixtures.

B. Description of the Prior Art

Compact fluorescent lamp fixtures have been developed to offer an effective and permanent solution for energy-efficient lighting at home and businesses. More recent advancement may be found in product lines under the trademark 'HALO' as described in US Patent Application Publication No. US 2008/0025031 of Wronski et al. The application describes a lighting fixture designed for recessed lighting on insulated ceilings with multiple adjustment features to facilitate installation and illumination customization. The three major components of the fixture for use with a fluorescent lamp are a lamp housing, a junction box and a replaceable ballast all mounted on telescoping bar hangers, which are in turn attached to construction studs or joists. The ballast is surface mounted by screws to a planar mounting plate of the junction box. However, due to the operational heat of the ballast that will add to the lamp heat, the ballast must be mounted on the junction box at the other side of the lamp housing at the cost of a maintenance personnel's problem. As shown in FIG. 1 attached to show the prior art, the junction box 1 of the lamp housing 2 is closed at sides by a first remountable wall plate 3 close to a ceiling opening 4 and the opposite ballast mounting plate 5, which is blocked from normal view through the opening 4. A spring clip 6 holds both plates 3 and 5 onto open ends of the junction box 1. The ballast 7 with end flanges is screw fastened to plate 5 and faces away from the first plate 3. The necessary heat dissipation from the lamp and ballast 7 needs a good physical clearance between the components for air circulation but at the same time is subjected to certain dimensional limit.

Eventually, when it is time to repair the lamp by replacing inoperable ballast 7, housing 2 is supposed to be first detached from its fixture base 8 but the existence or location of ballast 7 is impossible to detect from under the ceiling through the access opening 4 without a prior knowledge or consulting the original installation guide. In addition, identifying and releasing the plate 5/ballast 7 assembly are not all necessary to replace the bad ballast 7. It must be replaced with a new one by unscrewing and screwing at least two screw fasteners on the plate 5.

Above all, such inability to access to the major connected part may undermine the stated lighting fixture improvements when many of these ballasts will reach the service life and need replacements in series. An ideal ballast fixture for this purpose should be associated with the fixture junction box at an easy location to find and replace while taking up less space of the fixture.

In view of the foregoing need for improvement and others, an object of the present invention is to provide a lamp ballast with a built-in bracket that is integral to its casing and attaches directly to a junction box of a fluorescent lighting fixture.

Another object of the present invention is to provide a lamp ballast with an advanced bracket section for mounting on a junction box resulting in little to none protrusion from the surface of the junction box to freely place the ballast at the best location to work with during maintenance.

Yet another object of the present invention is to provide an economic solution to encase a lamp ballast as well as fasten it to a lighting fixture without adding a third component and instead with loosing existing fastening hardware and its metal weight.

SUMMARY OF THE INVENTION

A fluorescent lamp ballast of the present invention may be used in associated with a recessed lighting fixture and is adapted to a direct low profile mounting on a junction box of the lighting fixture by a varying degree of recessed positioning.

In one embodiment, the lamp ballast may comprise: a ballast circuit on a board; a package for enclosing the circuit board save electric wires from and to the ballast circuit at multiple sides including a top surface, bottom surface and sidewalls extending between the top and bottom surfaces to connect the same surfaces; and a flange extending from the sidewalls of the package at a predetermined level between the top and bottom surfaces. Thus, the flange provides an integral bracket of the ballast for a varied degree of recessed mounting of the ballast on the lamp fixture. The package and circumferential rim are integrally molded of thermoformable resin. Or, they may be made of folded sheet metal. The flange has a male and female fastening sections at opposite ends for mounting and demounting with respect to complementary sections of the lamp fixture.

In a preferred embodiment of the present invention, a ballast with a built-in bracket for attachment to a fluorescent lamp fixture comprises a ballast circuit on a board; an upper case including a base plane, two opposite perpendicular planes, two opposite sidewalls between the perpendicular planes and an entrance for introducing the circuit board into the package; and a generally planar lower case overextending beyond the area of the upper case and having a predetermined depth of large central recess shaped for fixedly inserting the upper case, whereby the overextending area of the lower case provides an integral bracket of the ballast for a varied degree of recessed mounting of the ballast on the lamp fixture. The upper case is made of sheet metal cut and folded into an open box structure. The lower case is made of sheet metal by deep drawing.

Alternatively, the lower case may be made of sheet metal cut and folded into an open tray structure. The lower case has a male and female fastening sections at opposite ends for mating with complementary sections of the lamp fixture.

Embodiments of the invention will now be described by way of example with reference to the accompanying drawings.

BRIEF DESCRIPTION OF THE DRAWINGS

Similar reference numbers denote corresponding features throughout the attached drawings.

Call Out List of Elements

| | | |
|---|---|---|
| 1: Junction Box | 2: Lamp Housing | 3: First Wall Plate |
| 4: Ceiling Opening | 5: Ballast Mounting Plate | 6: Spring Clip |
| 7: Ballast | 8: Fixture Base | 9: Screw Tab |
| 10: Ballast | 11: Bottom Hole | 12: Ballast Case |
| 13: Ballast Circuit | 14: First Shell | 16: Entrance |
| 18: Second Shell | 20: Niche | 22: Base Plane |
| 24: Perpendicular Plane | 26: Junction | 28: Sidewall |
| 30: End Flap | 32: Aperture | 34: Bracket |
| 36: Hook | 38: V-notch | 40: Latch |
| 41: Bonding Material | 42: Opening | 44: Bushing |
| 108: Second Shell | 110: Bottom Plane | 112: Sidewall |
| 114a, 114b: Trapezoid Plane | 116: Hook | 118: Perpendicular Plane |
| 120: Trapezoid Plane | 122: End | 124: V-notch |
| 126: Central Opening | 128: End Flap | 130: Latch |

DETAILED DESCRIPTION OF THE PREFERRED EMBODIMENT

Figure 2:
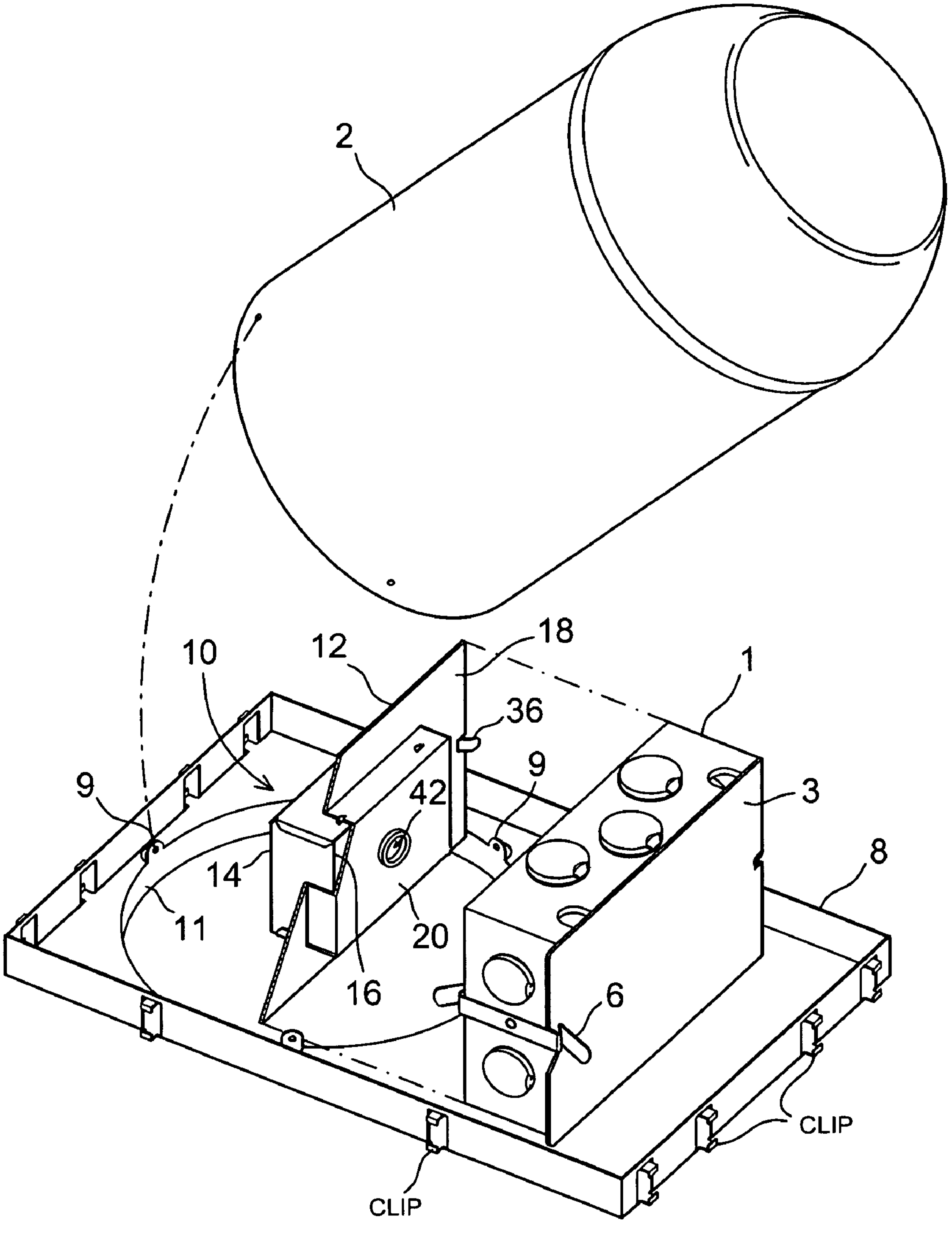
FIG. 2 is an exploded perspective view of a lighting fixture employing a ballast according to one embodiment of the invention.

Turning now to FIG. 2, rectangular lamp fixture base 8 has multiple clips for slidably holding paired hanger bars (not shown) to fix the base 8 adjustably to building joists about the ceiling openings designated to make illuminations. The fixture base 8 fixedly supports junction box 1 and fluorescent lamp housing 2 having an internal lamp socket that is wired to a power line leading through junction box 1 to which a remote switch is also connected. Fixture base 8 also has a large brimmed hole 11 that coincides with the ceiling opening. Extending from around the hole 11 are multiple screw tabs 9 for initially fastening lamp housing 2 to base 8 and eventually become release points to remove housing 2 to gain access to the electric components on base 8. Thus, upon electrical connection inside junction box 1 a lamp in housing 2 provides a recessed illumination down through the ceiling opening.

According to the present invention, a ballast 10 shown partially cut away is adapted to mount onto base 8 almost frontally facing bottom hole 11 of base 8. Ballast 10 has a metal case 12 for enclosing a known electronic ballast circuit 13 (FIG. 4) for providing an appropriate electric power for the fluorescent lamp, which in this fixture design may use a compact lamp type. Ballast case 12 may be applied to alternative electromagnetic ballasts successfully. Case 12 comprises a first shell 14 with an entrance 16 for accommodating the circuit and a second shell 18 shaped like a tray with a central niche 20 for snuggly receiving first shell 14 to close entrance 16. The first shell can be made of plastic or metal.

Figure 3:
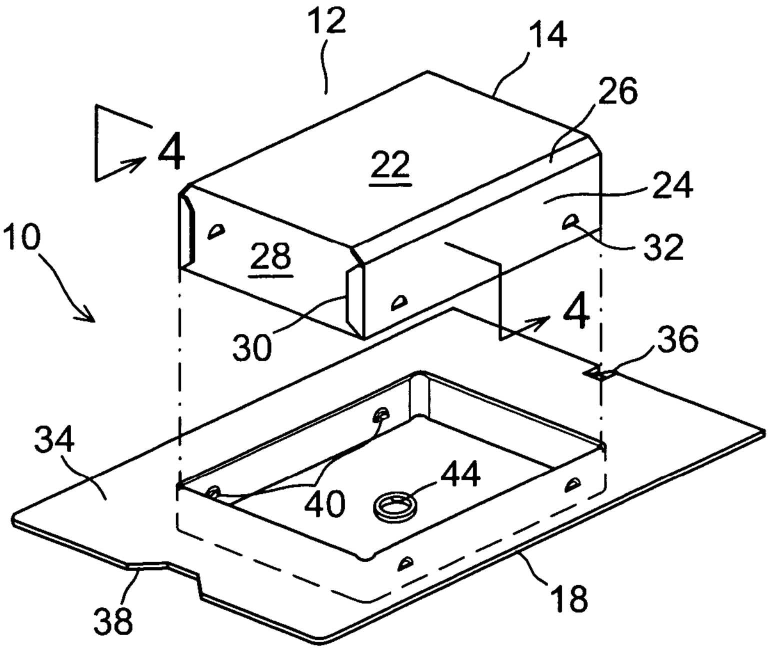
FIG. 3 is an exploded perspective view of the ballast of FIG. 1, showing a stamped bracket.

FIG. 3 shows ballast 10 within case 12 that may be made of a single sheet metal cut and folded into an open box that includes a rectangular base plane 22, two opposite perpendicular planes 24 connected to base plane 22 via optional chamfer junctions 26 and two sidewalls 28 shaped to close the side polygonal apertures formed by edges of base plane 22, folded junctions 26 and folded perpendicular planes 24. Each of perpendicular planes 24 has two end flaps 30, which are folded over proximal sidewalls 28 to keep them secured together. Also formed on each perpendicular plane 24 are two semicircular apertures 32 for interconnecting first shell 14 with the counterparts of second shell 18. Apertures 32 are oriented so that straight edges are closer to the open edges of shell box 14. Bracket 34 may be stamped as shown in FIG. 3.

On the other hand, second shell 18 is made of another sheet metal that may go through a deep drawing process to construct an enclosure cover having central niche 20 sized to fit over a predetermined height of first shell 14. The rest of niche

20 extends in a plane parallel to base plane 22 of first shell 14 and becomes a working member of bracket 34 for mounting ballast 10 on junction box 1. Bracket 34 may be shaped similarly to the first remountable wall plate 3 in that it has a bent hook 36 at one side edge for a latching penetration into a slot (not shown) of junction box 1 and a V-notch 38 formed at the opposite side edge for mating with spring clip 6 of junction box 1.

A firm attachment between first and second shells 16, 18 is provided by four depressed latches 40 that protrudes inwardly of niche 20 at the corresponding level to engage the straight edges of apertures 32 when the first shell 14 is assembled with internal ballast circuit 13 and then pressed into second shell 18. The preinstalled ballast circuit 13 may be attached to inner surfaces of first and second shells 14, 18 by a bonding material 41 for stability. Centrally of niche 20 there is formed an opening 42 for passage of wires in and out of the ballast circuit. To ensure insulation of the ballast wires, a plastic bushing 44 may be installed to smooth the inner diameter of opening 42.

Alternatively, the bushing 44 can be made as a stamped bushing which is integral to the second shell by stamping a round edge into the face of the second shell in the same operation as the stamping of the opening. In this way, the wires avoid a sharp surface while avoiding the use of a plastic bushing.

Figure 1:
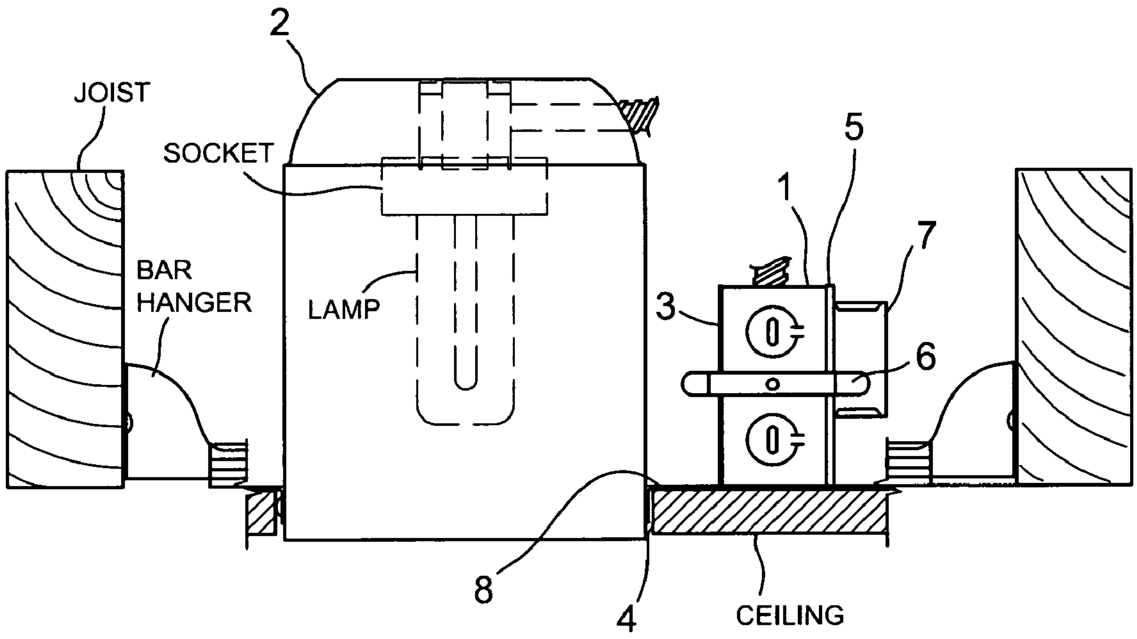
FIG. 1 PRIOR ART
FIG. 1 is a side elevational view of lighting fixture of prior art.
Figure 4:
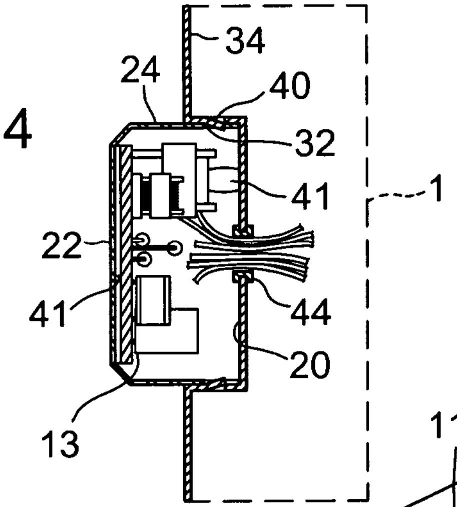
FIG. 4 is a cross sectional view of the ballast taken along line 4-4 of FIG. 3.

When assembled, case 12 becomes a firm unit that has integral bracket 34 surrounding the sides of ballast 10 as shown well in FIG. 4 wherein ballast 10 has been turned 90 degrees for attachment to the upright junction box 1. The position of bracket 34 along the perpendicular planes 24 is adaptable to particular application of lamp fixtures. In an extreme case of junction box 1, bracket 34 may extend flush with base plane 22 of first shell 14 so that there is virtually no protrusion from junction box 1, which still has the enough interior space remained to house the entire ballast in first shell 14 besides its primary occupants of electric wires and the associated connectors. Because junction box 1 has occupied unused space in the lamp fixture as well as a redundant ballast mounting plate 5 as shown in FIG. 1, the inventive provision of ballast 10 with the positioning bracket advances the conventional art of ballasting the lamp in two ways: new serviceable location of ballast through space saving and a substantial saving of material by simply negating the necessity of the component of mounting plate 5.

Alternatively, ballast 10 of the present invention may be packaged by a case formed of a different material such as thermoplastic resin. In such case, a single piece enclosure may be molded about ballast circuit 13 leaving the necessary connecting wires leading from the enclosure. A bracket similar to bracket 34 complete with hook 36 and V-notch 38 may be integrally formed to the enclosure at any levels between the top and bottom surfaces of the enclosure varying the degree of protrusion of ballast 10 with respect to junction box 1. Inside the enclosure, ballast circuit 13 may be encapsulated by appropriate filler for protection.

Figure 5:
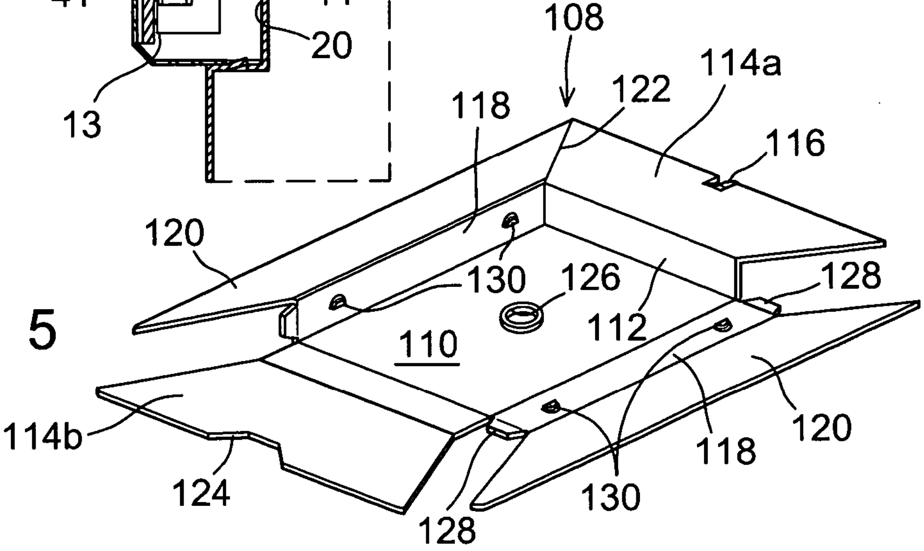
FIG. 5 is a perspective view of a bottom case under shaping according to an alternate embodiment of the present invention, showing a folded bracket.

FIG. 5 shows an alternative embodiment of second shell presently assigned numeral 108, which is partially processed to show both before and after folding of a blank sheet metal. Here, the shell metal is folded with respect to a bottom plane 110 to form one of two opposite rectangular sidewalls 112 and a trapezoid plane 114*a* extending from sidewall 112 at 90 degrees externally and having a bent hook 116. Next to sidewall 112 and trapezoid plane 114*a* are one of two opposite perpendicular planes 118 and an outwardly folded trapezoid plane 120 that meets with trapezoid plane 114*a* along their proximal ends 122. The other trapezoid plane 114*b* may have a V-notch 124 for accepting the engagement of spring clip 6 of junction box 1 shown in FIG. 2. A central opening 126 is formed similar to opening 42 of second shell 18 in the earlier embodiment for the passage of wires.

In order to reinforce the enclosure cover resulting from first shell 108, two opposite end flaps 128 may be formed on the respective perpendicular planes 118 to crimp over the proximal sidewalls 112 and bind them together. Perpendicular planes 118 also include inwardly protruding latches 130 at the corresponding locations to apertures 32 of first shell 14 that may fit perfectly with this embodiment of second shell 108. The advantage of this folding second shell 108 is that it needs lighter folding works compared to the high-pressure deep drawing method.

Therefore, while the presently preferred form of the lamp ballast with advanced bracket has been shown and described, and several modifications thereof discussed, persons skilled in this art will readily appreciate that various additional changes and modifications may be made without departing from the spirit of the invention, as defined and differentiated by the following claims.

The invention claimed is:

1. A lamp ballast for attachment to a fluorescent lamp fixture comprising:

a ballast circuit on a board, wherein the ballast circuit is an electronic ballast;

a package for enclosing the circuit board save electric wires from and to the ballast circuit at multiple sides including a top surface, bottom surface and sidewalls extending between the top and bottom surfaces to connect the same surfaces; and a flange extending from the sidewalls of the package at a predetermined level between the top and bottom surfaces, whereby the flange provides an integral bracket of the ballast for a varied degree of recessed mounting of the ballast on the lamp fixture, wherein the package and circumferential rim are in rectangular shapes, further comprising a ballast case having a first shell and a second shell, wherein a niche is formed on the second shell, further comprising an opening formed on the niche.

2. A lamp ballast for attachment to a fluorescent lamp fixture comprising:

a ballast circuit on a board, wherein the ballast circuit is an electronic ballast;

a package for enclosing the circuit board save electric wires from and to the ballast circuit at multiple sides including a top surface, bottom surface and sidewalls extending between the top and bottom surfaces to connect the same surfaces; and a flange extending from the sidewalls of the package at a predetermined level between the top and bottom surfaces, whereby the flange provides an integral bracket of the ballast for a varied degree of recessed mounting of the ballast on the lamp fixture, wherein the package and circumferential rim comprise: a ballast case having a first shell and a second shell, wherein a niche is formed on the second shell, further comprising an opening formed on the niche, wherein the first shell is made of plastic and the second shell is made of metal.

3. A lamp ballast for attachment to a fluorescent lamp fixture comprising:

a ballast circuit on a board, wherein the ballast circuit is an electronic ballast;

a package for enclosing the circuit board save electric wires from and to the ballast circuit at multiple sides including a top surface, bottom surface and sidewalls extending between the top and bottom surfaces to connect the same surfaces; and a flange extending from the sidewalls of the package at a predetermined level between the top and bottom surfaces, whereby the flange provides an integral bracket of the ballast for a varied degree of recessed mounting of the ballast on the lamp fixture, further comprising a ballast case having a first shell and a second shell, wherein the second shell has a hook at a first side and a V-notch opposing the hook at a second side.

4. A lamp ballast for attachment to a fluorescent lamp fixture comprising:

a ballast circuit on a board, wherein the ballast circuit is an electronic ballast;

a package for enclosing the circuit board save electric wires from and to the ballast circuit at multiple sides including a top surface, bottom surface and sidewalls extending between the top and bottom surfaces to connect the same surfaces; and a flange extending from the sidewalls of the package at a predetermined level between the top and bottom surfaces, whereby the flange provides an integral bracket of the ballast for a varied degree of recessed mounting of the ballast on the lamp fixture, wherein the flange has a male and female fastening sections at opposite ends for mating with complementary sections of the lamp fixture.

5. A lamp ballast with a built-in bracket for attachment to a fluorescent lamp fixture comprising:

a ballast circuit on a board, wherein the ballast circuit is an electronic ballast;

an upper case including a base plane, two opposite perpendicular planes, two opposite sidewalls between the perpendicular planes and an entrance for introducing the circuit board into the package; and a generally planar lower case overextending beyond the area of the upper case and having a predetermined depth of large central recess shaped for fixedly inserting the upper case, whereby the overextending area of the lower case provides an integral bracket of the ballast for a varied degree of recessed mounting of the ballast on the lamp fixture, wherein a ballast case has a first shell and a second shell, wherein the second shell has a hook at a first side and a V-notch opposing the hook at a second side.

6. A lamp ballast with a built-in bracket for attachment to a fluorescent lamp fixture comprising:

a ballast circuit on a board, wherein the ballast circuit is an electronic ballast;

an upper case including a base plane, two opposite perpendicular planes, two opposite sidewalls between the perpendicular planes and an entrance for introducing the circuit board into the package; and a generally planar lower case overextending beyond the area of the upper case and having a predetermined depth of large central recess shaped for fixedly inserting the upper case, whereby the overextending area of the lower case provides an integral bracket of the ballast for a varied degree of recessed mounting of the ballast on the lamp fixture, further comprising a ballast case having a first shell and a second shell, wherein the lower case is made of sheet metal by deep drawing forming a niche on the second shell, further comprising an opening formed on the niche.

7. The lamp ballast of claim 6, wherein the lower case has a male and female fastening sections at opposite ends for mating with complementary sections of the lamp fixture.

8. A lamp ballast with a built-in bracket for attachment to a fluorescent lamp fixture comprising:

a ballast circuit on a board, wherein the ballast circuit is an electronic ballast;

an upper case including a base plane, two opposite perpendicular planes, two opposite sidewalls between the perpendicular planes and an entrance for introducing the circuit board into the package; and a generally planar lower case overextending beyond the area of the upper case and having a predetermined depth of large central recess shaped for fixedly inserting the upper case, whereby the overextending area of the lower case provides an integral bracket of the ballast for a varied degree of recessed mounting of the ballast on the lamp fixture, wherein the lower case is made of sheet metal cut and folded into an open tray structure, wherein the lower case has a male and female fastening sections at opposite ends for mating with complementary sections of the lamp fixture.

9. The lamp ballast of claim 8, further comprising a stamped bushing.

10. The lamp ballast of claim 8, wherein the package and circumferential rim comprise: a ballast case having a first shell and a second shell, wherein a niche is formed on the second shell, further comprising an opening formed on the niche, wherein the first shell is made of plastic and the second shell is made of metal.

11. A lamp ballast with a built-in bracket for attachment to a fluorescent lamp fixture comprising:

a ballast circuit on a board, wherein the ballast circuit is an electronic ballast;

an upper case including a base plane, two opposite perpendicular planes, two opposite sidewalls between the perpendicular planes and an entrance for introducing the circuit board into the package; and a generally planar lower case overextending beyond the area of the upper case and having a predetermined depth of large central recess shaped for fixedly inserting the upper case, whereby the overextending area of the lower case provides an integral bracket of the ballast for a varied degree of recessed mounting of the ballast on the lamp fixture; wherein a ballast case has a first shell and a second shell, wherein the second shell has a hook at a first side and a V-notch opposing the hook at a second side; and a round stamped bushing; wherein the package and circumferential rim comprise: a ballast case having a first shell and a second shell, wherein a niche is formed on the second shell, further comprising an opening formed on the niche, wherein the first shell is made of plastic and the second shell is made of metal.

* * * * *